(12) United States Patent
Fu et al.

(10) Patent No.: US 9,773,928 B2
(45) Date of Patent: Sep. 26, 2017

(54) SOLAR CELL WITH ELECTROPLATED METAL GRID

(75) Inventors: Jianming Fu, Palo Alto, CA (US); Zheng Xu, Pleasanton, CA (US); Chentao Yu, Sunnyvale, CA (US); Jiunn Benjamin Heng, San Jose, CA (US)

(73) Assignee: TESLA, INC., Palo Alto, CA (US)

( * ) Notice: Subject to any disclaimer, the term of this patent is extended or adjusted under 35 U.S.C. 154(b) by 0 days.

(21) Appl. No.: 13/220,532

(22) Filed: Aug. 29, 2011

(65) Prior Publication Data

US 2012/0060911 A1    Mar. 15, 2012

Related U.S. Application Data

(60) Provisional application No. 61/381,659, filed on Sep. 10, 2010.

(51) Int. Cl.
*H01L 31/0224* (2006.01)
*H01L 31/068* (2012.01)

(52) U.S. Cl.
CPC .... *H01L 31/022425* (2013.01); *H01L 31/068* (2013.01); *Y02E 10/547* (2013.01)

(58) Field of Classification Search
CPC ....... H01L 31/02168; H01L 31/022458; H01L 31/02245; H01L 31/022441
See application file for complete search history.

(56) References Cited

U.S. PATENT DOCUMENTS

| 819,360 | A | 3/1902 | Mayer |
| 2,626,907 | A | 1/1953 | De Groote |
| 2,938,938 | A | 5/1960 | Dickson |
| 3,094,439 | A | 6/1963 | Mann et al. |
| 3,116,171 | A | 12/1963 | Nielsen |
| 3,459,597 | A | 8/1969 | Baron |
| 3,961,997 | A | 6/1976 | Chu |
| 3,969,163 | A | 7/1976 | Wakefield |
| 4,015,280 | A | 3/1977 | Matsushita et al. |
| 4,082,568 | A | 4/1978 | Lindmayer |

(Continued)

FOREIGN PATENT DOCUMENTS

| CN | 101553933 | 10/2009 |
| CN | 102012010151 | 1/2010 |

(Continued)

OTHER PUBLICATIONS

Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.*

(Continued)

*Primary Examiner* — Jayne Mershon
(74) *Attorney, Agent, or Firm* — Shun Yao; Park, Vaughan, Fleming & Dowler, LLP

(57) ABSTRACT

One embodiment of the present invention provides a method for fabricating solar cells. During operation, an anti-reflection layer is deposited on top of a semiconductor structure to form a photovoltaic structure, and a front-side electrode grid comprising a metal stack is formed on top of the photovoltaic structure. The metal stack comprises a metal-adhesive layer comprising Ti or Ta, and a conducting layer comprising Cu or Ag situated above the metal-adhesive layer.

13 Claims, 5 Drawing Sheets

(continued)

(56) References Cited

U.S. PATENT DOCUMENTS

| | | |
|---|---|---|
| 4,124,410 A | 11/1978 | Kotval et al. |
| 4,124,455 A * | 11/1978 | Lindmayer ............. C25D 5/34 148/DIG. 20 |
| 4,193,975 A | 3/1980 | Kotval et al. |
| 4,200,621 A | 4/1980 | Liaw et al. |
| 4,213,798 A | 7/1980 | Williams et al. |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder et al. |
| 4,342,044 A | 7/1982 | Ovshinsky et al. |
| 4,431,858 A | 2/1984 | Gonzalez et al. |
| 4,514,579 A | 4/1985 | Hanak |
| 4,540,843 A | 9/1985 | Gochermann et al. |
| 4,567,642 A | 2/1986 | Dilts et al. |
| 4,571,448 A | 2/1986 | Barnett |
| 4,577,051 A | 3/1986 | Hartman |
| 4,586,988 A | 5/1986 | Nath et al. |
| 4,589,191 A | 5/1986 | Green et al. |
| 4,612,409 A | 9/1986 | Hamakawa et al. |
| 4,617,421 A | 10/1986 | Nath |
| 4,633,033 A | 12/1986 | Nath et al. |
| 4,652,693 A | 3/1987 | Bar-On |
| 4,657,060 A * | 4/1987 | Kaucic ................... E06B 9/361 160/168.1 V |
| 4,667,060 A | 5/1987 | Spitzer |
| 4,670,096 A | 6/1987 | Schwirtlich |
| 4,694,115 A * | 9/1987 | Lillington et al. ............ 136/256 |
| 4,753,683 A | 6/1988 | Ellion |
| 4,771,017 A | 9/1988 | Tobin et al. |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,075,763 A * | 12/1991 | Spitzer et al. ................. 257/751 |
| 5,084,107 A | 1/1992 | Deguchi |
| 5,118,361 A | 6/1992 | Fraas |
| 5,131,933 A | 7/1992 | Flodl et al. |
| 5,178,685 A | 1/1993 | Borenstein |
| 5,181,968 A | 1/1993 | Nath et al. |
| 5,213,628 A | 5/1993 | Noguchi et al. |
| 5,217,539 A * | 6/1993 | Fraas et al. ................... 136/246 |
| 5,279,682 A | 1/1994 | Wald et al. |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi et al. |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo et al. |
| 5,676,766 A * | 10/1997 | Probst et al. ................. 136/265 |
| 5,681,402 A | 10/1997 | Ichinose et al. |
| 5,698,451 A | 12/1997 | Hanoka |
| 5,705,828 A | 1/1998 | Noguchi et al. |
| 5,726,065 A | 3/1998 | Szlufcik et al. |
| 5,808,315 A | 9/1998 | Murakami |
| 5,814,195 A | 9/1998 | Lehan et al. |
| 5,903,382 A | 5/1999 | Tench et al. |
| 5,935,345 A | 8/1999 | Kuznicki |
| 6,034,322 A | 3/2000 | Pollard |
| 6,091,019 A | 7/2000 | Sakata et al. |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan et al. |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel et al. |
| 6,586,270 B2 | 7/2003 | Tsuzuki et al. |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura et al. |
| 7,164,150 B2 | 1/2007 | Terakawa et al. |
| 7,328,534 B2 | 2/2008 | Dinwoodie |
| 7,388,146 B2 | 6/2008 | Fraas |
| 7,399,385 B2 | 7/2008 | German et al. |
| 7,534,632 B2 | 5/2009 | Hu et al. |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German et al. |
| 7,977,220 B2 | 7/2011 | Sanjurjo |
| 8,070,925 B2 | 12/2011 | Hoffman et al. |
| 8,115,093 B2 | 2/2012 | Gui |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 2001/0008143 A1 | 7/2001 | Sasaoka et al. |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1* | 1/2003 | Gonsiorawski ... B32B 17/10018 136/251 |
| 2003/0000571 A1 | 1/2003 | Wakuda |
| 2003/0034062 A1 | 2/2003 | Stern |
| 2003/0042516 A1 | 3/2003 | Forbes et al. |
| 2003/0070705 A1 | 4/2003 | Hayden et al. |
| 2003/0097447 A1 | 5/2003 | Johnston |
| 2003/0116185 A1 | 6/2003 | Oswald |
| 2003/0121228 A1 | 7/2003 | Stoehr |
| 2003/0168578 A1 | 9/2003 | Taguchi et al. |
| 2003/0183270 A1 | 10/2003 | Falk et al. |
| 2003/0201007 A1 | 10/2003 | Fraas |
| 2004/0065363 A1 | 4/2004 | Fetzer et al. |
| 2004/0103937 A1 | 6/2004 | Bilyalov et al. |
| 2004/0112426 A1 | 6/2004 | Hagino |
| 2004/0123897 A1 | 7/2004 | Ojima et al. |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira et al. |
| 2005/0022861 A1* | 2/2005 | Rose et al. ..................... 136/256 |
| 2005/0061665 A1 | 3/2005 | Pavani |
| 2005/0064247 A1 | 3/2005 | Sane |
| 2005/0074954 A1 | 4/2005 | Yamanaka |
| 2005/0109388 A1 | 5/2005 | Murakami et al. |
| 2005/0133084 A1 | 6/2005 | Joge et al. |
| 2005/0178662 A1 | 8/2005 | Wurczinger |
| 2005/0189015 A1 | 9/2005 | Rohatgi et al. |
| 2005/0199279 A1 | 9/2005 | Yoshimine et al. |
| 2005/0252544 A1 | 11/2005 | Rohatgi et al. |

(56) References Cited

U.S. PATENT DOCUMENTS

| | | |
|---|---|---|
| 2005/0257823 A1 | 11/2005 | Zwanenburg |
| 2006/0012000 A1 | 1/2006 | Estes et al. |
| 2006/0060238 A1 | 3/2006 | Hacke et al. |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach et al. |
| 2006/0231803 A1 | 10/2006 | Wang et al. |
| 2006/0255340 A1 | 11/2006 | Manivannan et al. |
| 2006/0260673 A1 | 11/2006 | Takeyama |
| 2006/0272698 A1 | 12/2006 | Durvasula |
| 2006/0283496 A1 | 12/2006 | Okamoto et al. |
| 2006/0283499 A1 | 12/2006 | Terakawa et al. |
| 2007/0023081 A1 | 2/2007 | Johnson et al. |
| 2007/0023082 A1 | 2/2007 | Manivannan et al. |
| 2007/0108437 A1 | 5/2007 | Tavkhelidze |
| 2007/0110975 A1 | 5/2007 | Schneweis |
| 2007/0132034 A1 | 6/2007 | Curello et al. |
| 2007/0137699 A1 | 6/2007 | Manivannan et al. |
| 2007/0148336 A1* | 6/2007 | Bachrach .......... C23C 14/35 427/97.1 |
| 2007/0186968 A1 | 8/2007 | Nakauchi |
| 2007/0186970 A1 | 8/2007 | Takahashi et al. |
| 2007/0202029 A1 | 8/2007 | Burns et al. |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann et al. |
| 2007/0283997 A1 | 12/2007 | Hachtmann |
| 2008/0000522 A1 | 1/2008 | Johnson |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar et al. |
| 2008/0053519 A1 | 3/2008 | Pearce |
| 2008/0061293 A1 | 3/2008 | Ribeyron |
| 2008/0092947 A1 | 4/2008 | Lopatin et al. |
| 2008/0121272 A1 | 5/2008 | Besser et al. |
| 2008/0121276 A1 | 5/2008 | Lopatin et al. |
| 2008/0121932 A1 | 5/2008 | Ranade |
| 2008/0128013 A1 | 6/2008 | Lopatin |
| 2008/0149161 A1 | 6/2008 | Nishida et al. |
| 2008/0156370 A1 | 7/2008 | Abdallah et al. |
| 2008/0173347 A1 | 7/2008 | Korevaar |
| 2008/0173350 A1 | 7/2008 | Choi et al. |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness et al. |
| 2008/0230122 A1 | 9/2008 | Terakawa et al. |
| 2008/0251114 A1* | 10/2008 | Tanaka .......... B65D 75/002 136/251 |
| 2008/0251117 A1 | 10/2008 | Schubert et al. |
| 2008/0264477 A1 | 10/2008 | Moslehi |
| 2008/0276983 A1 | 11/2008 | Drake et al. |
| 2008/0283115 A1 | 11/2008 | Fukawa et al. |
| 2008/0302030 A1 | 12/2008 | Stancel et al. |
| 2008/0303503 A1 | 12/2008 | Wolfs |
| 2008/0308145 A1 | 12/2008 | Krasnov et al. |
| 2009/0007965 A1 | 1/2009 | Rohatgi et al. |
| 2009/0056805 A1 | 3/2009 | Barnett |
| 2009/0078318 A1 | 3/2009 | Meyers et al. |
| 2009/0084439 A1 | 4/2009 | Lu et al. |
| 2009/0101872 A1 | 4/2009 | Young et al. |
| 2009/0139512 A1 | 6/2009 | Lima |
| 2009/0151783 A1 | 6/2009 | Lu et al. |
| 2009/0155028 A1 | 6/2009 | Boguslavskiy |
| 2009/0160259 A1 | 6/2009 | Naiknaware et al. |
| 2009/0188561 A1 | 7/2009 | Aiken et al. |
| 2009/0221111 A1 | 9/2009 | Frolov et al. |
| 2009/0229854 A1 | 9/2009 | Fredenberg |
| 2009/0239331 A1 | 9/2009 | Xu et al. |
| 2009/0250108 A1 | 10/2009 | Zhou et al. |
| 2009/0255574 A1 | 10/2009 | Yu et al. |
| 2009/0283138 A1 | 11/2009 | Lin et al. |
| 2009/0283145 A1 | 11/2009 | Kim et al. |
| 2009/0293948 A1 | 12/2009 | Tucci et al. |
| 2009/0308439 A1 | 12/2009 | Adibi |
| 2009/0317934 A1 | 12/2009 | Scherff |
| 2009/0320897 A1* | 12/2009 | Shimomura .......... 136/244 |
| 2010/0006145 A1 | 1/2010 | Lee |
| 2010/0015756 A1* | 1/2010 | Weidman et al. .......... 438/96 |
| 2010/0043863 A1 | 2/2010 | Wudu |
| 2010/0065111 A1 | 3/2010 | Fu et al. |
| 2010/0068890 A1 | 3/2010 | Stockum et al. |
| 2010/0084009 A1 | 4/2010 | Carlson |
| 2010/0087031 A1 | 4/2010 | Veschetti |
| 2010/0108134 A1* | 5/2010 | Ravi .......... 136/256 |
| 2010/0116325 A1 | 5/2010 | Nikoonahad |
| 2010/0124619 A1 | 5/2010 | Xu et al. |
| 2010/0132774 A1 | 6/2010 | Borden |
| 2010/0132792 A1 | 6/2010 | Kim et al. |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |
| 2010/0236612 A1 | 9/2010 | Khajehoddin |
| 2010/0240172 A1 | 9/2010 | Rana |
| 2010/0269904 A1 | 10/2010 | Cousins |
| 2010/0279492 A1 | 11/2010 | Yang |
| 2010/0300506 A1 | 12/2010 | Heng et al. |
| 2010/0300507 A1 | 12/2010 | Heng et al. |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0073175 A1 | 3/2011 | Hilali |
| 2011/0088762 A1 | 4/2011 | Singh |
| 2011/0146759 A1 | 6/2011 | Lee |
| 2011/0146781 A1* | 6/2011 | Laudisio et al. .......... 136/256 |
| 2011/0156188 A1 | 6/2011 | Tu |
| 2011/0168250 A1* | 7/2011 | Lin et al. .......... 136/256 |
| 2011/0168261 A1 | 7/2011 | Welser |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng et al. |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch et al. |
| 2011/0308573 A1 | 12/2011 | Jaus |
| 2012/0000502 A1 | 1/2012 | Wiedeman |
| 2012/0012174 A1 | 1/2012 | Wu |
| 2012/0028461 A1 | 2/2012 | Ritchie et al. |
| 2012/0031480 A1 | 2/2012 | Tisler |
| 2012/0040487 A1 | 2/2012 | Asthana |
| 2012/0073975 A1 | 3/2012 | Ganti |
| 2012/0080083 A1* | 4/2012 | Liang .......... H01L 31/02168 136/256 |
| 2012/0085384 A1 | 4/2012 | Beitel et al. |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0167986 A1 | 7/2012 | Meakin |
| 2012/0192932 A1 | 8/2012 | Wu et al. |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng et al. |
| 2012/0325282 A1 | 12/2012 | Snow |

(56) References Cited

U.S. PATENT DOCUMENTS

| | | | |
|---|---|---|---|
| 2013/0000705 A1 | 1/2013 | Shappir |
| 2013/0014802 A1 | 1/2013 | Zimmerman |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0124013 A1 | 5/2014 | Morad et al. |
| 2014/0124014 A1 | 5/2014 | Morad et al. |
| 2014/0154836 A1 | 6/2014 | Kim |
| 2014/0196768 A1 | 7/2014 | Heng et al. |
| 2014/0242746 A1 | 8/2014 | Albadri |
| 2014/0318611 A1 | 10/2014 | Moslehi |
| 2014/0345674 A1 | 11/2014 | Yang et al. |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0171230 A1 | 6/2015 | Kapur |
| 2015/0214409 A1 | 7/2015 | Pfeiffer |
| 2015/0270410 A1 | 9/2015 | Heng |
| 2015/0280641 A1 | 10/2015 | Garg |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0190354 A1 | 6/2016 | Agrawal |

FOREIGN PATENT DOCUMENTS

| | | |
|---|---|---|
| CN | 102263157 | 11/2011 |
| CN | 2626907 A1 | 3/2015 |
| DE | 4030713 | 4/1992 |
| DE | 102006009194 | 8/2007 |
| DE | 202007002897 | 8/2008 |
| DE | 102010061317 | 6/2012 |
| DE | 10201201051 | 11/2013 |
| DE | H04245683 A | 11/2013 |
| EP | 1770791 | 4/2007 |
| EP | 1816684 | 8/2007 |
| EP | 2071635 | 6/2009 |
| EP | 2113946 | 11/2009 |
| EP | 2362430 | 8/2011 |
| EP | 2002057357 A | 11/2011 |
| EP | 2479796 A1 | 8/2013 |
| EP | 2479796 | 7/2015 |
| EP | 2626907 | 8/2015 |
| JP | 2011008881 A2 | 9/1992 |
| JP | 2385561 A2 | 9/1995 |
| JP | H07249788 A | 9/1995 |
| JP | 10004204 | 1/1998 |
| JP | H1131834 | 2/1999 |
| JP | 2000164902 | 6/2000 |
| JP | 2010085949 | 2/2002 |
| JP | 20050122721 A | 6/2005 |
| JP | 2006324504 | 11/2006 |
| JP | 2008135655 | 6/2008 |
| JP | 2009054748 | 3/2009 |
| JP | 2009177225 | 8/2009 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 2003083953 A1 | 12/2005 |
| KR | 2005159312 A | 1/2006 |
| KR | 2006097189 A1 | 2/2009 |
| WO | 9120097 A1 | 11/1991 |
| WO | 2011005447 A2 | 12/1991 |
| WO | 91017839 | 10/2003 |
| WO | 20060003277 A | 9/2006 |
| WO | 2008089657 | 7/2008 |
| WO | 2009094578 | 7/2009 |
| WO | 2009150654 | 12/2009 |
| WO | 20090011519 A | 12/2009 |
| WO | 2010070015 | 6/2010 |
| WO | 2009150654 A2 | 7/2010 |
| WO | 2010075606 | 7/2010 |
| WO | 2010075606 A1 | 9/2010 |
| WO | 2010123974 | 10/2010 |
| WO | 2010580957 C | 10/2010 |
| WO | 2010104726 A2 | 1/2011 |
| WO | 2010123974 A1 | 1/2011 |
| WO | 2011005447 | 1/2011 |
| WO | 2011008881 | 1/2011 |
| WO | 2011053006 | 5/2011 |
| WO | 104409402 | 10/2011 |
| WO | 2011123646 A2 | 7/2012 |
| WO | 2013020590 | 2/2013 |
| WO | 2013020590 A1 | 2/2013 |
| WO | 2013046351 | 4/2013 |
| WO | 2014074826 | 5/2014 |
| WO | 2014110520 | 7/2014 |
| WO | 2014117138 | 7/2014 |
| WO | 2015183827 | 12/2015 |
| WO | 2016090332 | 6/2016 |

OTHER PUBLICATIONS

Benick et al., High efficiency n-type PERT and PERL solar cells, IEEE, pp. 3637-3640 (2014).*

Jianhua Zhao et al. "24% Efficient pert silicon solar cell: Recent improvements in high efficiency silicon cell research".

Davies, P.C.W., 'Quantum tunneling time,' Am. J. Phys. 73, Jan. 2005, pp. 23-27.

Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.

Beaucarne G et al: 'Epitaxial thin-film Si solar cells' Thin Solid Films, Elsevier-Sequoia S.A. Lausanne, CH LNKD—DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].

(56) References Cited

OTHER PUBLICATIONS

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.
Merriam-Webster online dictionary—"mesh". (accessed Oct. 8, 2012).
National Weather Service Weather Forecast Office ("Why Do We have Seasons?" http://www.crh.noaa.gov/lmk/?n=seasons Accessed Oct. 18, 2014).
Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20l.pptx> and converted to PDF.
Green, Martin A. et al., 'High-Efficiency Silicon Solar Cells,' IEEE Transactions on Electron Devices, vol. ED-31, No. 5, May 1984, pp. 679-683.
Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.
WP Leroy et al., "In Search for the Limits of Rotating Cylindrical Magnetron Sputtering", Magnetron, ION Processing and ARC Technologies European Conference, Jun. 18, 2010, pp. 1-32.
Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.
JCS Pires, J Otubo, AFB Braga, PR Mei; The purification of metallurgical grade silicon by electron beam melting, J of Mats Process Tech 169 (2005) 16-20.
Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.
Mueller, Thomas, et al. "High quality passivation for heterojunction solar cells by hydrogenated amorphous silicon suboxide films." Applied Physics Letters 92.3 (2008): 033504-033504.
Munzer, K.A. "High Throughput Industrial In-Line Boron BSF Diffusion" Jun. 2005. 20th European Photovoltaic Solar Energy Conference, pp. 777-780.
O'Mara, W.C.; Herring, R.B.; Hunt L.P. (1990). Handbook of Semiconductor Silicon Technology. William Andrew Publishing/Noyes. pp. 275-293.
Stangl et al., Amorphous/Crystalline Silicon heterojunction solar cells—a simulation study; 17th European Photovoltaic Conference, Munich, Oct. 2001.
Chabal, Yves J. et al., 'Silicon Surface and Interface Issues for Nanoelectronics,' The Electrochemical Society Interface, Spring 2005, pp. 31-33.
Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.
Parthavi, "Doping by Diffusion and Implantation", <http://www.leb.eei.uni-erlangen.de/winterakademie/2010/report/course03/pdf/0306.pdf>.
Weiss, "Development of different copper seed layers with respect to the copper electroplating process," Microelectronic Engineering 50 (2000) 443-440, Mar. 15, 2000.
Tomasi, "Back-contacted Silicon Heterojunction Solar Cells With Efficiency>21%" 2014 IEEE.
Hornbachner et al., "Cambered Photovoltaic Module and Method for its Manufacture" Jun. 17, 2009.
Machine translation of JP 10004204 A, Shindou et al.
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.
L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.
"Nonequilibrium boron doping effects in low-temperature epitaxial silicon" Meyerson et al., Appl. Phys. Lett. 50 (2), p. 113 (1987).
"Doping Diffusion and Implantation" Parthavi, <http://www.leb.eei.uni-erlangen.de/winterakademie/2010/report/content/course03/pdf/0306.pdf>.

* cited by examiner

SOLAR CELL WITH ELECTROPLATED METAL GRID

RELATED APPLICATION

This application claims the benefit of U.S. Provisional Application No. 61/381,659, entitled "SOLAR CELL WITH METAL GRIDS FABRICATED BY USING ELECTROPLATING," by inventors Jianming Fu, Zheng Xu, Chentao Yu, and Jiunn Benjamin Heng, filed 10 Sep. 2010.

BACKGROUND

Field

This disclosure is generally related to designing of solar cells. More specifically, this disclosure is related to a solar cell that includes a metal grid fabricated by an electroplating technique.

Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photovoltaic effect. There are several basic solar cell structures, including a single p-n junction solar cell, a p-i-n/n-i-p solar cell, and a multi junction solar cell. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal bandgaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi junction structure includes multiple single junction structures of different bandgaps stacked on top of one another.

In a solar cell, light is absorbed near the p-n junction, generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

FIG. 1 presents a diagram illustrating an exemplary homojunction solar cell based on a crystalline-Si (c-Si) substrate (prior art). Solar cell 100 includes a front-side Ag electrode grid 102, an anti-reflection layer 104, an emitter layer 106, a substrate 108, and an aluminum (Al) back-side electrode 110. Arrows in FIG. 1 indicate incident sunlight.

In conventional c-Si based solar cells, the current is collected by front-side Ag grid 102. To form Ag grid 102, conventional methods involve printing Ag paste (which often includes Ag particle, organic binder, and glass frit) onto the wafers and then firing the Ag paste at a temperature between 700° C. and 800° C. The high-temperature firing of the Ag paste ensures good contact between Ag and Si, and lowers the resistivity of the Ag lines. The resistivity of the fired Ag paste is typically between $5 \times 10^{-6}$ and $8 \times 10^{-6}$ ohm-cm, which is much higher than the resistivity of bulk silver.

In addition to the high series resistance, the electrode grid obtained by screen-printing Ag paste also has other disadvantages, including higher material cost, wider line width, and limited line height. As the price of silver rises, the material cost of the silver electrode has exceeded half of the processing cost for manufacturing solar cells. With the state-of-the-art printing technology, the Ag lines typically have a line width between 100 and 120 microns, and it is difficult to reduce the line width further. Although inkjet printing can result in narrower lines, inkjet printing suffers other problems, such as low productivity. The height of the Ag lines is also limited by the printing method. One print can produce Ag lines with a height that is less than 25 microns. Although multiple printing can produce lines with increased height, it also increases line width, which is undesirable for high-efficiency solar cells. Similarly, electroplating of Ag or Cu onto the printed Ag lines can increase line height at the expense of increased line width. In addition, the resistance of such Ag lines is still too high to meet the requirement of high-efficiency solar cells.

Another solution is to electroplate a Ni/Cu/Sn metal stack directly on the Si emitter. This method can produce a metal grid with lower resistance (the resistivity of plated Cu is typically between $2 \times 10^{-6}$ and $3 \times 10^{-6}$ ohm-cm). However, the adhesion of Ni to Si is less than ideal, and stress from the metal stack may result in peeling of the whole metal lines.

SUMMARY

One embodiment of the present invention provides a method for fabricating solar cells. During operation, an anti-reflection layer is deposited on top of a photovoltaic structure, and a front-side electrode grid comprising a metal stack is formed on top of the anti-reflection layer. The metal stack comprises a metal-adhesive layer comprising Ti or Ta, and a conducting layer comprising Cu or Ag situated above the metal-adhesive layer.

In a variation on the embodiment, the metal-adhesive layer further comprises one or more of: TiN, TiW, TiSi, TaN, and Co.

In a variation on the embodiment, the metal-adhesive layer is formed using a physical vapor deposition (PVD) technique including one of: evaporation and sputtering deposition.

In a variation on the embodiment, a soldering layer comprising Sn or Ag is formed on top of the conducting layer.

In a variation on the embodiment, the metal-adhesive layer has a thickness between 1 nm and 1000 nm.

In a further variation, the metal-adhesive layer has a thickness between 5 nm and 50 nm.

In a variation on the embodiment, the conducting layer is formed by depositing a metal seed layer above the metal-adhesive layer, and depositing a bulk-metal layer above the metal seed layer.

In a further variation, the metal seed layer is formed using a physical vapor deposition (PVD) technique including one of: evaporation and sputtering deposition.

In a further variation, the bulk-metal layer is formed by depositing a patterned masking layer on the metal seed layer and plating a layer of metal over the patterned masking layer. Openings of the masking layer correspond to positions of the front-side electrode grid, and the plated metal has a similar material makeup as that of the metal seed layer.

In a further variation, the method comprises removing the masking layer and performing an etching process to remove portions of the metal seed layer and the metal-adhesive layer that are not covered by the plated metal.

In a further variation, the bulk-metal layer is formed by depositing a patterned masking layer on the metal seed layer, performing an etching process to remove portions of the metal seed layer and the metal-adhesive layer that are not covered by the patterned masking layer, removing the patterned masking layer to expose un-etched portions of the metal seed layer, and plating a layer of metal over the un-etched portions of the metal seed layer. Areas covered by the patterned masking layer correspond to positions of the front-side electrode grid, and the plated metal has a similar material makeup as that of the metal seed layer.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a solar cell that includes a metal grid formed by electroplating. The solar cell includes a crystalline-Si (c-Si) substrate, an emitter layer, a passivation layer, a metal-adhesion layer, and front- and back-side electrode metal grids. The metal-adhesion layer is formed using a physical vapor deposition (PVD) technique, such as sputtering or evaporation. The front-side metal grid is formed by selectively electroplating a metal stack, which can be a single-layer or a multi-layer structure, on the metal-adhesion layer. The back-side electrode is formed by screen-printing, electroplating, or aerosol-jet printing of a metal grid.

Fabrication Process

Figure 1:
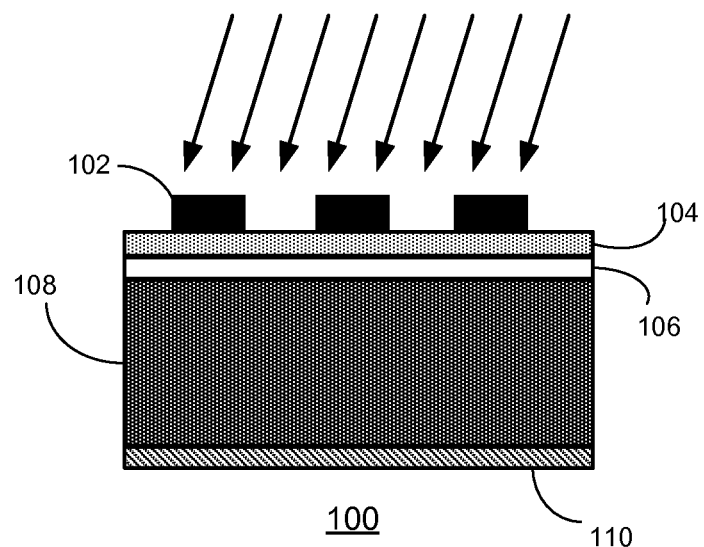
FIG. 1 presents a diagram illustrating an exemplary solar cell (prior art).
Figure 2:
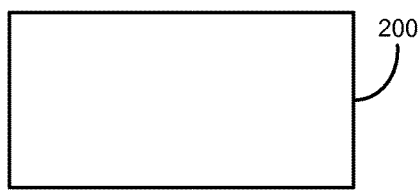
FIG. 2 presents a diagram illustrating an exemplary process of fabricating a solar cell in accordance with an embodiment of the present invention.
Figure 2:
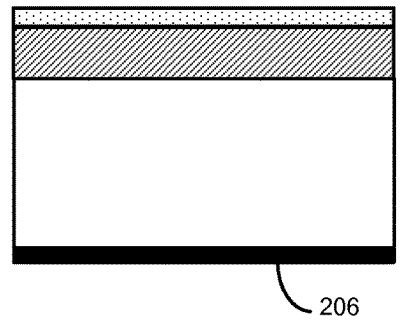
Figure 2:
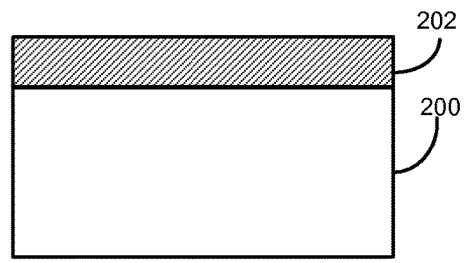
Figure 2:
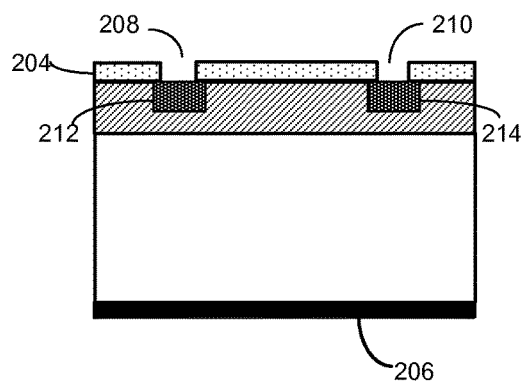
Figure 2:
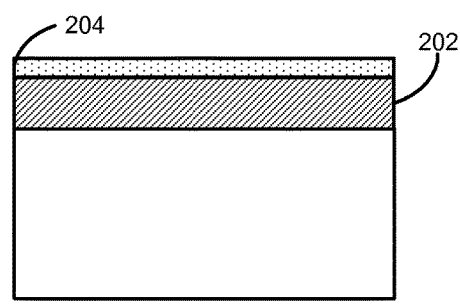
Figure 2:
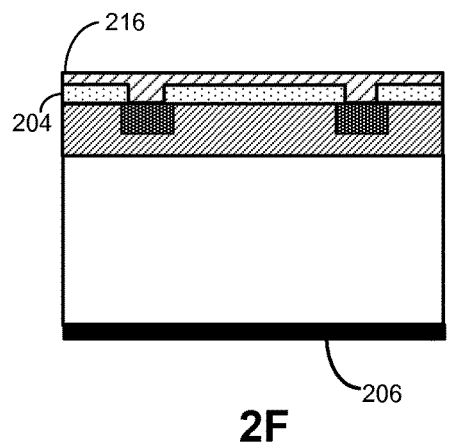
Figure 2:
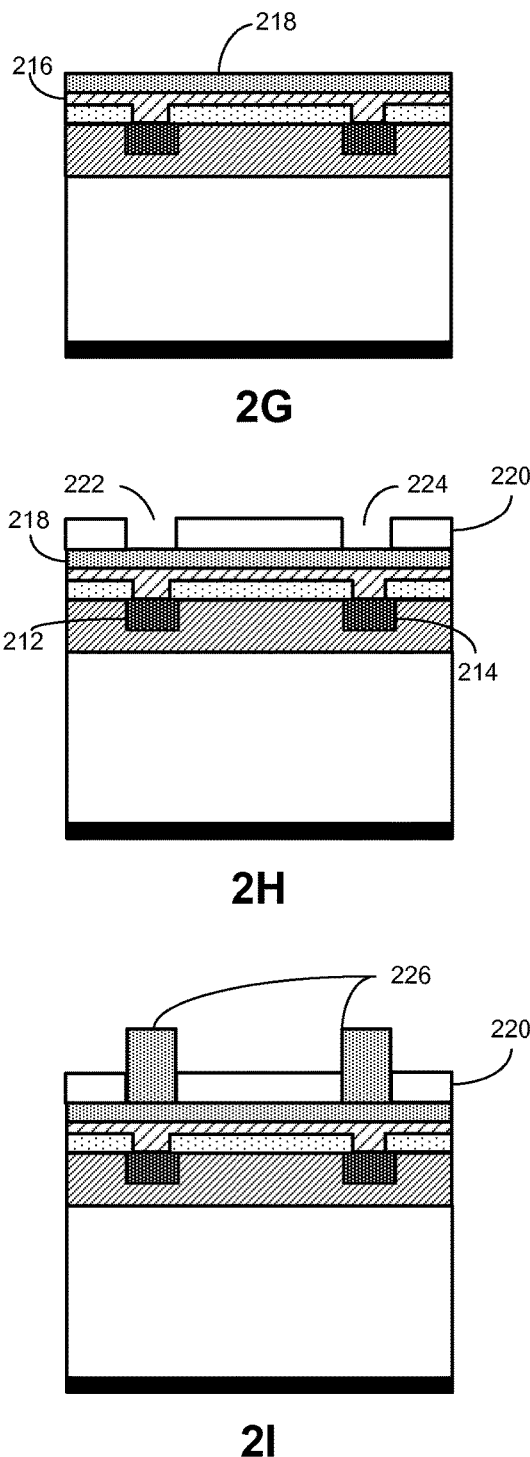
Figure 2:
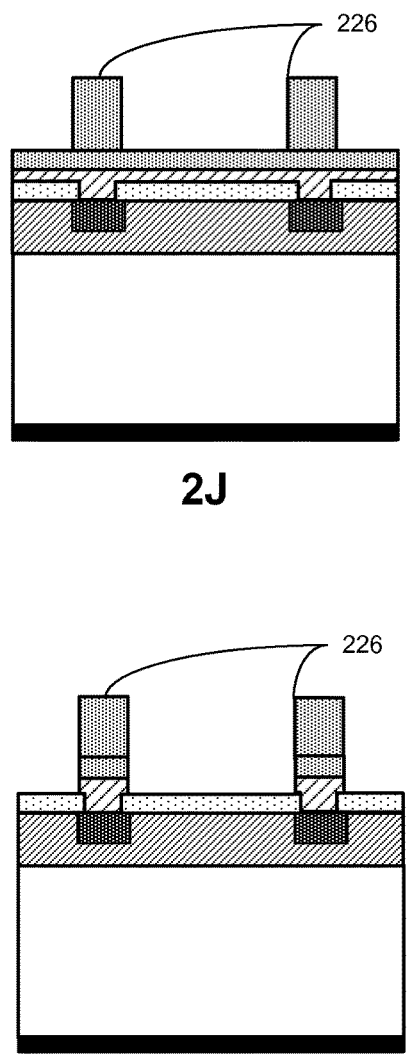

FIG. 2 presents a diagram illustrating an exemplary process of fabricating a solar cell in accordance with an embodiment of the present invention.

In operation 2A, a Si substrate 200 is prepared. In one embodiment, Si substrate 200 can be a p-type crystalline-Si (c-Si) wafer. In a further embodiment, preparing Si substrate 200 includes standard saw damage etch (which removes the damaged outer layer of Si) and surface texturing.

In operation 2B, a lightly doped emitter layer 202 is formed on top of Si substrate 200. Depending on the doping type of Si substrate 200, emitter layer 202 can be either n-type doped or p-type doped. In one embodiment, emitter layer 202 is lightly doped with n-type dopant. In a further embodiment, emitter layer 202 is formed by diffusing phosphorous. Note that if phosphorus diffusion is used for forming emitter layer 202, phosphosilicate glass (PSG) etch and edge isolation is needed.

In operation 2C, an anti-reflection layer 204 is formed on top of emitter layer 202. In one embodiment, anti-reflection layer 204 includes, but not limited to: silicon nitride ($SiN_x$), silicon oxide ($SiO_x$), titanium oxide ($TiO_x$), aluminum oxide ($Al_2O_3$), and their combinations. In one embodiment, anti-reflection layer 204 includes a layer of a transparent conducting oxide (TCO) material, such as indium tin oxide (ITO), aluminum zinc oxide (AZO), gallium zinc oxide (GZO), tungsten doped indium oxide (IWO), and their combinations.

In operation 2D, back-side electrode 206 is formed on the back side of Si substrate 200. In one embodiment, forming back-side electrode 206 includes printing a full Al layer and subsequent allying through firing. In one embodiment, forming back-side electrode 206 includes printing an Ag/Al grid and subsequent furnace firing.

In operation 2E, a number of contact windows, including windows 208 and 210, are formed in anti-reflection layer 204. In one embodiment, heavily doped regions, such as regions 212 and 214 are formed in emitter layer 202, directly beneath contact windows 208 and 210, respectively. In a further embodiment, contact windows 208 and 210 and heavily doped regions 212 and 214 are formed by spraying phosphorous on anti-reflection layer 204, followed by a laser-groove local-diffusion process. Note that operation 2E is optional, and is needed when anti-reflection layer is electrically insulating. If anti-reflection layer 204 is electrically conducting (e.g., when anti-reflection layer 204 is formed using TCO material), there is no need to form the contact windows.

In operation 2F, an adhesive layer 216 is formed on anti-reflection layer 204. In one embodiment, materials used to form adhesive layer 216 include, but are not limited to: Ti, titanium nitride ($TiN_x$), titanium tungsten ($TiW_x$), titanium silicide ($TiSi_x$), titanium silicon nitride (TiSiN), Ta, tantalum nitride ($TaN_x$), tantalum silicon nitride ($TaSiN_x$), nickel vanadium (NiV), tungsten nitride $WN_x$), Co, W, Cr, Mo, Ni, and their combinations. In a further embodiment, adhesive layer 216 is formed using a physical vapor deposition (PVD) technique, such as sputtering or evaporation. The thickness of adhesive layer 216 can range from a few nanometers up to 100 nm. Note that Ti and its alloys tend to form very good adhesion with Si material, and they can form good ohmic contact with heavily doped regions 212 and 214.

In operation 2G, a metal seed layer 218 is formed on adhesive layer 216. Metal seed layer 218 can include Cu or Ag. The thickness of metal seed layer 218 can be between 5 nm and 500 nm. In one embodiment, metal seed layer 218 has a thickness of 100 nm. Similarly to adhesive layer 216, metal seed layer 218 can be formed using a PVD technique.

In operation 2H, a patterned masking layer 220 is deposited on top of metal seed layer 218. The openings of masking layer 220, such as openings 222 and 224, correspond to the locations of contact windows 208 and 210, and thus are located above heavily doped regions 212 and 214. Note that openings 222 and 224 are slightly larger than contact windows 208 and 210. Masking layer 220 can include a patterned photoresist layer, which can be formed using a photolithography technique. In one embodiment, the photoresist layer is formed by screen-printing photoresist on top of the wafer. The photoresist is then baked to remove solvent. A mask is laid on the photoresist, and the wafer is exposed to UV light. After the UV exposure, the mask is removed, and the photoresist is developed in a photoresist developer. Openings 222 and 224 are formed after developing. The photoresist can also be applied by spraying, dip coating, or curtain coating. Dry film photoresist can also be used. Alternatively, masking layer 220 can include a layer of patterned silicon oxide ($SiO_2$). In one embodiment, masking layer 220 is formed by first depositing a layer of $SiO_2$ using a low-temperature plasma-enhanced chemical-vapor-deposition (PECVD) technique. In a further embodiment, masking layer 220 is formed by dip-coating the front surface of the wafer using silica slurry, followed by screen-printing an etchant that includes hydrofluoric acid or fluorides. Other masking materials are also possible, as long as the masking material is electrically insulating.

In operation 2I, one or more layers of metal are deposited at the openings of masking layer 220 to form a front-side metal grid 226. Front-side metal grid 226 can be formed using an electroplating technique, which can include electrodeposition, light-induced plating, and/or electroless deposition. In one embodiment, metal seed layer 218 and/or adhesive layer 216 are coupled to the cathode of the plating power supply, which can be a direct current (DC) power supply, via an electrode. Metal seed layer 218 and masking layer 220, which includes the openings, are submerged in an electrolyte solution which permits the flow of electricity. Note that, because only the openings within masking layer 220 are electrically conductive, metals will be selectively deposited into the openings, thus forming a metal grid with a pattern corresponding to that of the previously formed contact windows on anti-reflection layer 204. Depending on the material forming metal seed layer 218, front-side metal grid 226 can be formed using Cu or Ag. For example, if metal seed layer 218 is formed using Cu, front-side metal grid 226 is also formed using Cu. In addition, front-side metal grid 226 can include a multilayer structure, such as a Cu/Sn bi-layer structure, or a Cu/Ag bi-layer structure. The Sn or Ag top layer is deposited to assist a subsequent soldering process. When depositing Cu, a Cu plate is used at the anode, and the solar cell is submerged in the electrolyte suitable for Cu plating. The current used for Cu plating is between 0.1 ampere and 2 amperes for a wafer with a dimension of 125 mm×125 mm, and the thickness of the Cu layer is approximately tens of microns.

In operation 2J, masking layer 220 is removed.

In operation 2K, portions of adhesive layer 216 and metal seed layer 218 that are originally covered by masking layer 220 are etched away, leaving only the portions that are beneath front-side metal grid 226. In one embodiment, wet chemical etching process is used. Note that, because front-side metal grid 226 is much thicker (by several magnitudes) than adhesive layer 216 and metal seed layer 218, the etching has a negligible effect on front-side metal grid 226.

Figure 3:
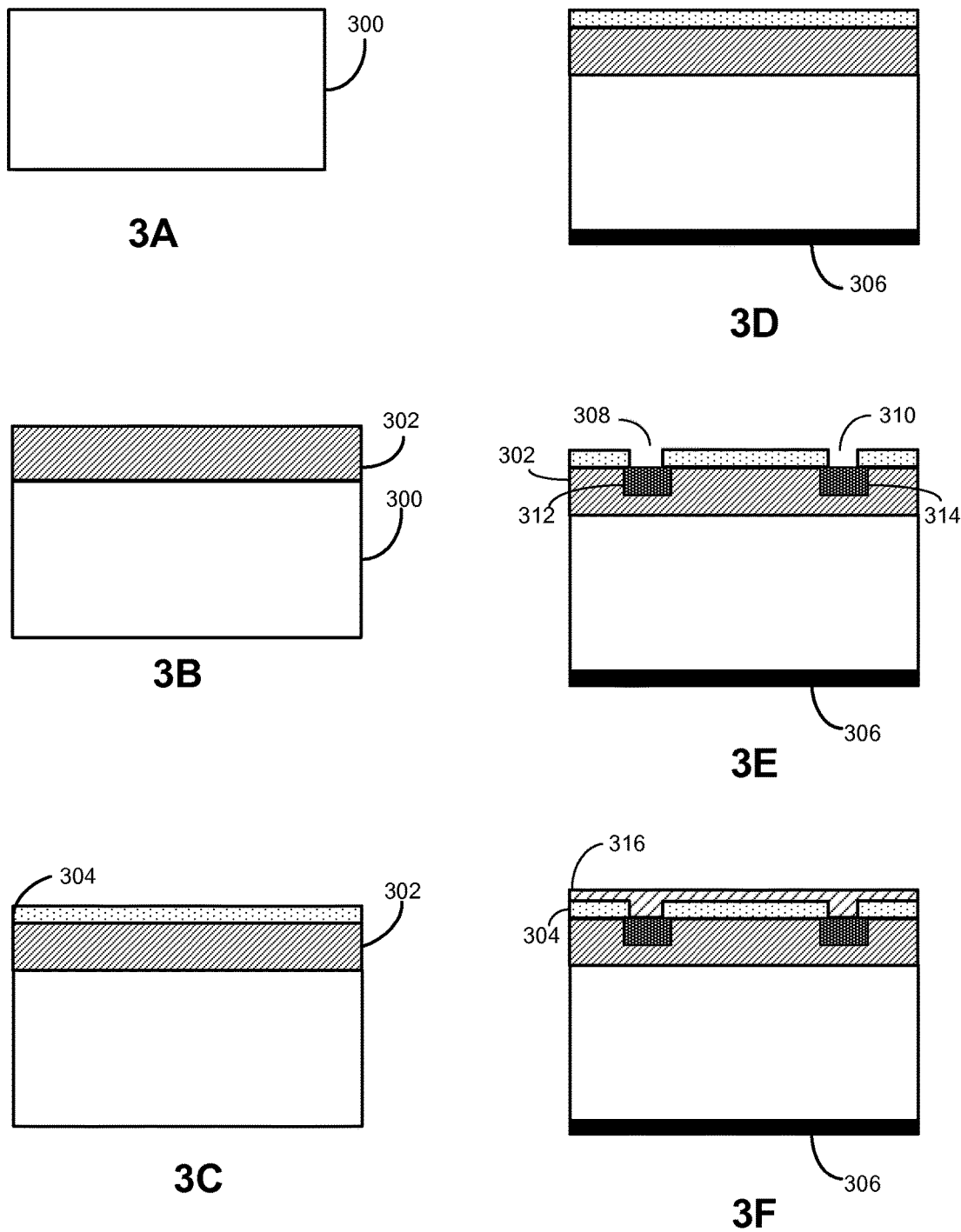
FIG. 3 presents a diagram illustrating an exemplary process of fabricating a solar cell in accordance with an embodiment of the present invention.
Figure 3:
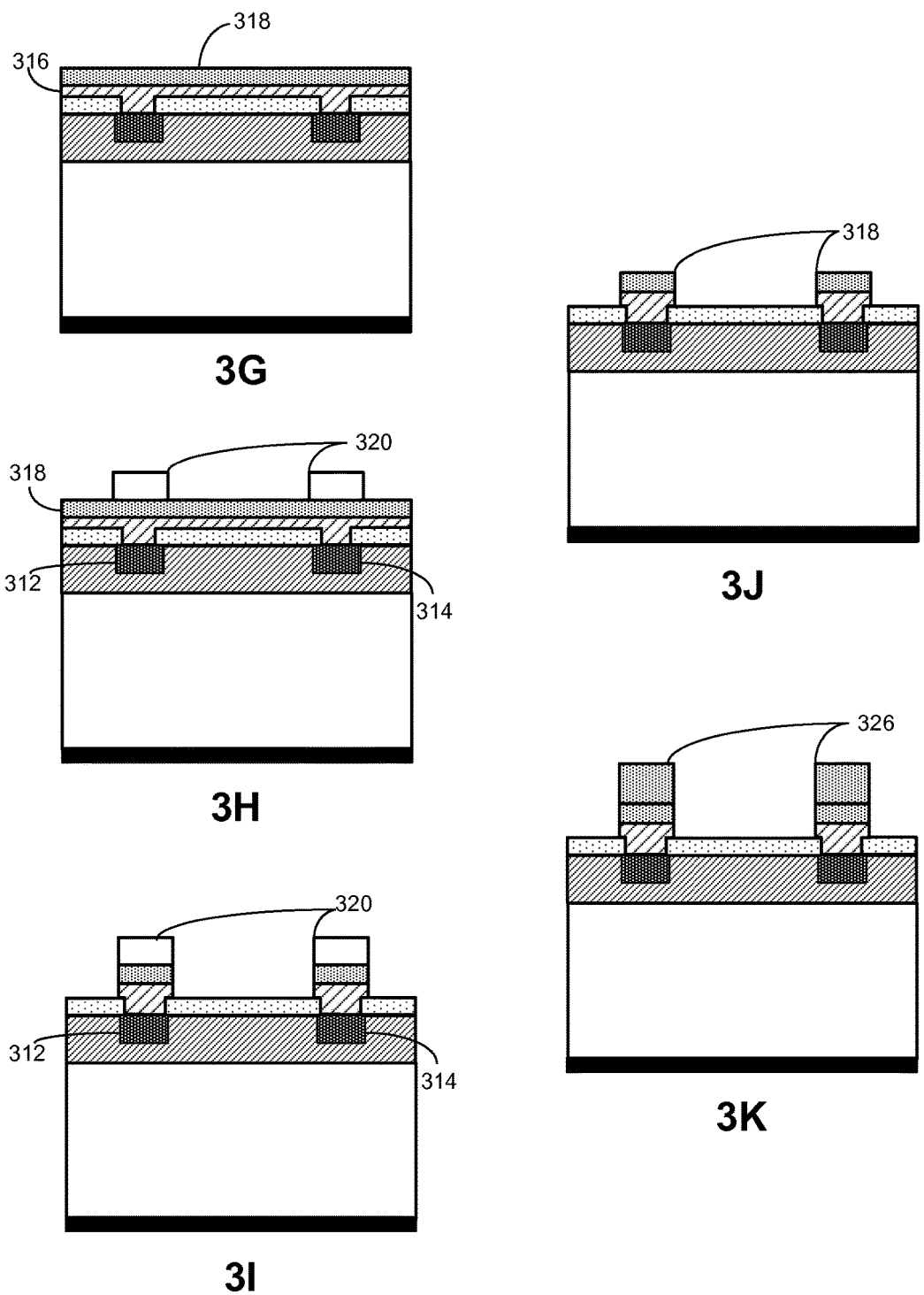

FIG. 3 presents a diagram illustrating another exemplary process of fabricating a solar cell in accordance with an embodiment of the present invention.

In operation 3A, a Si substrate 300 is prepared using a process similar to the one used in operation 2A.

In operation 3B, a lightly doped emitter layer 302 is formed on top of Si substrate 300, using a process similar to the one used in operation 2B.

In operation 3C, an anti-reflection layer 304 is formed on top of emitter layer 302, using a process similar to the one used in operation 2C.

In operation 3D, back-side electrode 306 is formed on the back side of Si substrate 300, using a process similar to the one used in operation 2D.

In operation 3E, a number of contact windows, including windows 308 and 310, are formed, using a process similar to the one used in operation 2E.

In one embodiment, heavily doped regions 312 and 314 are formed in emitter layer 302.

In operation 3F, an adhesive layer 316 is formed on anti-reflection layer 304, using a process similar to the one used in operation 2F.

In operation 3G, a metal seed layer 318 is formed on adhesive layer 316, using a process similar to the one used in operation 2G.

In operation 3H, a patterned masking layer 320 is deposited on top of metal seed layer 318 using a process similar to the one used in operation 2H. However, unlike patterned masking layer 220, patterned masking layer 320 covers areas that correspond to the locations of contact windows 308 and 310, while still being located above heavily doped regions 312 and 314. Note that the covered areas are slightly larger than contact windows 308 and 310.

In operation 3I, portions of adhesive layer 316 and metal seed layer 318 that are not covered by masking layer 320 are etched away using a process similar to the one used in operation 2K.

In operation 3J, masking layer 320 is removed to expose the leftover portions of metal seed layer 318.

In operation 3K, one or more layers of metal are deposited on the leftover portions of metal seed layer 318 to form a front-side metal grid 326, using a process similar to the one used in operation 2I. Note that, because only the leftover portions of metal seed layer 318 are electrically conductive, a plating process can selectively deposit metal on top of the leftover portions of metal seed layer 318.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar cell, comprising:
  a semiconductor photovoltaic structure comprising an emitter layer positioned on a base layer; and
  a first metallic grid positioned on a front side of the photovoltaic structure, wherein the first metallic grid includes:
    a metal-adhesive layer which comprises Ta and is in direct contact with the emitter layer;
    a Cu seed layer positioned on the metal-adhesive layer; and
    an electroplated Cu layer positioned on the Cu seed layer.

2. The solar cell of claim 1, wherein the metal-adhesive layer further comprises one or more of: Ti, Co, W, Cr, Mo, Ni, titanium nitride ($TiN_x$), titanium tungsten ($TiW_x$), titanium silicide ($TiSi_x$), titanium silicon nitride (TiSiN), tantalum nitride ($TaN_x$), tantalum silicon nitride ($TaSiN_x$), nickel vanadium (NiV), tungsten nitride ($WN_x$), and their combinations.

3. The solar cell of claim 1, wherein the first metallic grid further comprises a soldering layer comprising Sn or Ag positioned on the electroplated Cu layer.

4. The solar cell of claim 1, wherein the metal-adhesive layer has a thickness between 1 nm and 1000 nm.

5. The solar cell of claim 4, wherein the metal-adhesive layer has a thickness between 5 nm and 50 nm.

6. The solar cell of claim 1, wherein the photovoltaic structure further comprises an anti-reflection layer positioned on the emitter layer.

7. The solar cell of claim 6, wherein the anti-reflection layer is electrically insulating, and wherein the anti-reflection layer includes a number of openings, through which the metal-adhesive layer is in direct contact with the emitter layer.

8. The solar cell of claim 7, wherein the insulating anti-reflection layer includes at least one of:
   silicon nitride ($SiN_x$);
   silicon oxide ($SiO_x$);
   titanium oxide ($TiO_x$); and
   aluminum oxide.

9. The solar cell of claim 6, wherein the anti-reflection layer includes a transparent conducting oxide (TCO) layer, and wherein the metal adhesive layer is in contact with the TCO layer.

10. The solar cell of claim 9, wherein the TCO layer includes at least one of:
    indium tin oxide (ITO);
    aluminum zinc oxide (AZO);
    gallium zinc oxide (GZO); and
    tungsten doped indium oxide (IWO).

11. The solar cell of claim 1, wherein the Cu seed layer has a thickness between 5 nm and 500 nm.

12. The solar cell of claim 1, wherein the metal adhesive layer and the Cu seed layer are formed using a physical vapor deposition technique.

13. The solar cell of claim 12, wherein the physical vapor deposition technique includes one of: evaporation and sputtering deposition.

* * * * *